United States Patent [19]

Jensen et al.

[11] Patent Number: 4,584,839

[45] Date of Patent: Apr. 29, 1986

[54] MULTI-STAGE CRYOGENIC REFRIGERATORS

[75] Inventors: Jack E. Jensen, Columbus, Ohio; Charles B. Hood, Naples, Fla.; Harold C. Parish, Dublin, Ohio

[73] Assignee: CVI Incorporated, Hilliard, Ohio

[21] Appl. No.: 627,123

[22] Filed: Jul. 2, 1984

[51] Int. Cl.[4] ............................................. F25B 9/00
[52] U.S. Cl. .......................................... 62/6; 60/520
[58] Field of Search ............................... 62/6; 60/520

[56] References Cited

U.S. PATENT DOCUMENTS

| | | | |
|---|---|---|---|
| 3,310,954 | 3/1967 | Sijtstra et al. | 62/6 |
| 3,365,896 | 1/1968 | Berry | 62/6 |
| 3,400,544 | 9/1968 | Prast | 62/6 |
| 3,426,525 | 2/1969 | Rubin | 62/6 |
| 4,335,579 | 6/1982 | Sugimoto | 62/6 |
| 4,438,631 | 3/1984 | Sarcia | 62/6 |

Primary Examiner—Ronald C. Capossela
Attorney, Agent, or Firm—Seidel, Gonda, Goldhammer & Abbott

[57] ABSTRACT

First and second multi-stage cryogenic refrigerators each have a displacer driven by a common motor so that the displacers are substantially 180° out of phase. The final stage of each refrigerator has a regenerator arranged in a heat exchange relationship with counterflow.

12 Claims, 3 Drawing Figures

MULTI-STAGE CRYOGENIC REFRIGERATORS

BACKGROUND

Prior art cryogenic refrigerators provided heretofore and capable of providing refrigeration in the range of 4.5° to 10° K. are limited to applications of technical endeavor where cost is not an overriding consideration and highly technical staffs are available to maintain the refrigerators. A simple system using liquid helium from a bulk liquid helium storage dewar, which is transferred to a device for test or operation, requires personnel with a large amount of technical skill just to accomplish the transfer with a minimum of losses.

The cost of liquid helium alone makes such a system impractical for continued research and/or operation. Such systems are usually limited to a few tests necessary to provide operating characteristics or proof-of-principle. For long term operation, most users prefer closed cycle refrigerators. The present equipment, used extensively in the area of radio telescopes, makes use of a two-stage cryogenic refrigerator to cool a stream of high pressure helium to a low enough temperature so that a net refrigeration effect is realized when the helium is expanded through a Joule-Thomson valve. That system is reasonably efficient but complicated and costly while requiring trained personnel for operation and maintenance. In addition, the Joule-Thomson valve is extremely sensitive to impurities in the helium because the orifice area of the valve is typically $3.6 \times 10^{-2}$ mm² which gradually becomes restricted, further causing a deterioration in a refrigeration capacity.

The problem addressed herein is how to develop a small closed cycle cryocooler producing refrigeration in the temperature range of 4.5°–10° K. Most of the work done by others for improving a prior art refrigerator relates to the regenerator matrix and in particular the design and materials thereof. Since helium is the working fluid, it is obvious that there is a mismatch between the heat capacities of the regenerator matrix and helium. In order to balance the two, it is necessary to increase the amount of matrix which increases the void volume of the regenerator and/or the pressure drop. In order to attain the above-mentioned temperature range, it appears necessary to have very large regenerator masses such as 6,000 grams and heat transfer areas such as 20,000 cm². These heat exchangers are considered to be too large to be of any practical value. When the regenerator mass is reduced down to a realistic value such as 500 grams, approximately twice the mass used in standard machines today, cooling and/or net refrigeration decreased below 10° K. with apparent warming occurring in the region of interest.

SUMMARY OF THE INVENTION

As will be made clear hereinafter, the problems associated with the prior art have been solved by using first and second known cryogenic refrigerators having multiple stages. A motor means is provided for operating said refrigerators 180° out of phase. The last stage of each unit includes a regenerator. The regenerators of the last stages are arranged in heat exchange relationship.

It is an object of the present invention to provide a cryogenic refrigerator which solves the problems associated with the prior art by providing apparatus having first and second cryogenic refrigerators interelated in a manner and timed so that mass flows through the final heat exchange element are reasonably well-balanced.

Other objects and advantages of the present invention will appear hereinafter.

For the purpose of illustrating the invention, there is shown in the drawings a form which is presently preferred; it being understood, however, that this invention is not limited to the precise arrangements and instrumentalities shown.

DETAILED DESCRIPTION

Figure 1:
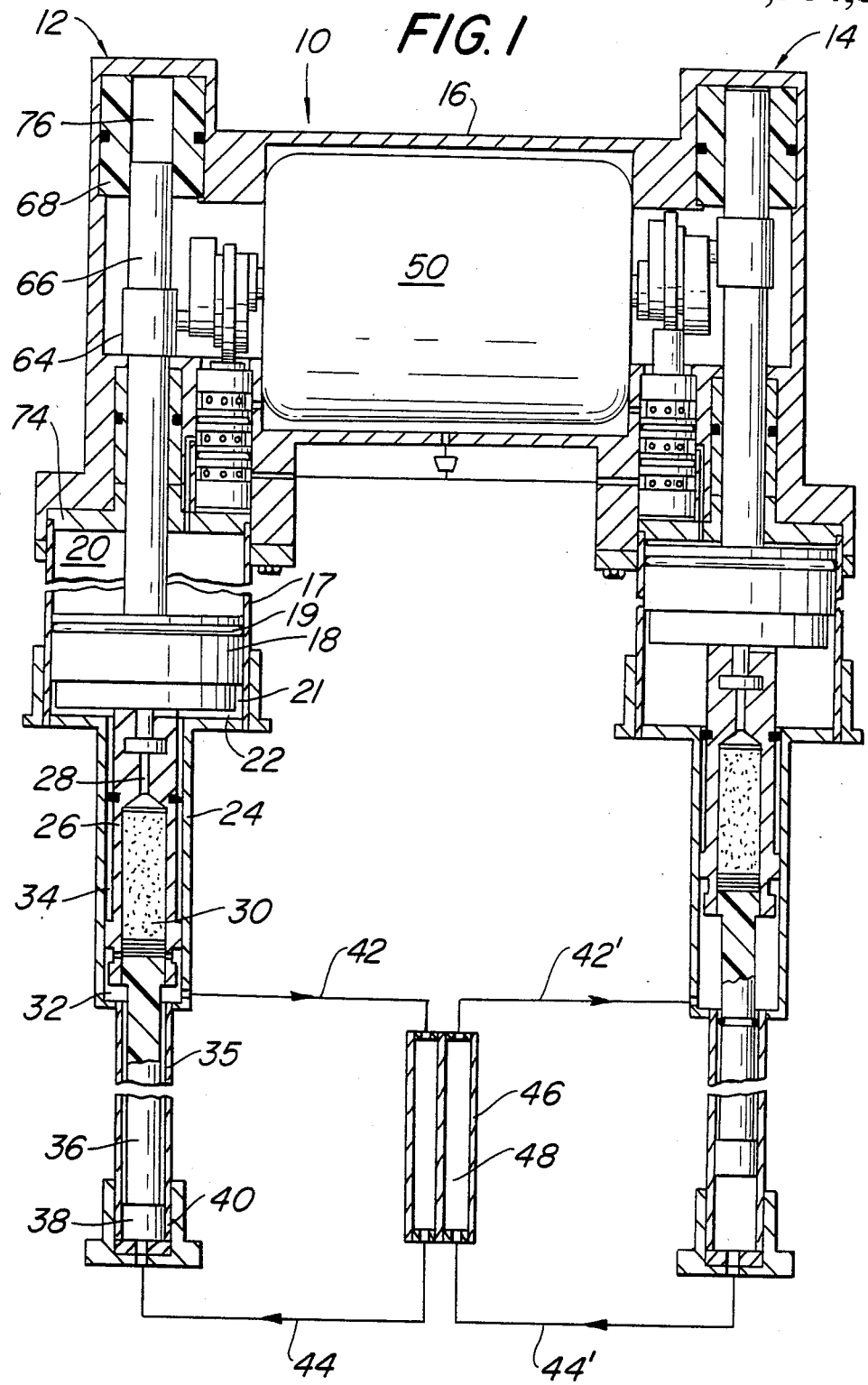
FIG. 1 is a sectional view through apparatus in accordance with the present invention.

Referring to the drawings in detail, wherein like numerals indicate like elements, there is shown a cryogenic refrigeration apparatus in accordance with the present invention designated generally as 10. The apparatus 10 includes first and second cryogenic multistage refrigerators designated 12 and 14 coupled together by way of a common housing 16. The refrigerators 12 and 14 are identical but 180° out of phase as will be made clear hereinafter. Hence, only refrigerator 12 will be described in detail with corresponding elements of refrigerator 14 being identified by primed numerals.

The refrigerator 12 has a plurality of stages. As shown, refrigerator 12 has three stages. The stages are disposed within a vacuum housing not shown. The first stage includes a displacer 18 within a housing 17. The displacer 18 has a length less than the length of housing 17 so as to define a warm chamber 20 thereabove and a cold chamber 22 therebelow. The designations warm and cold are relative as is well known to those skilled in the art.

Within the displacer 18, there is provided a regenerator 19 containing a matrix. Ports communicate the upper end of the matrix in regenerator 19 with the warm chamber 20. Radially disposed ports communicate the lower end of the matrix in regenerator 19 with a clearance space 21 disposed between the outer periphery of the lower end of displacer 18 and the inner periphery of housing 17. Thus, the lower end of the matrix in regenerator 19 communicates with cold chamber 22 by way of the radial ports and clearance 21 which is an annular gap heat exchanger.

The matrix in regenerator 19 is preferably a stack of 200 mesh material having high specific heat such as 95/5 copper-zinc bronze. The matrix has low void area and low pressure drop. The matrix may be made from other materials such as lead spheres, nylon, glass, etc.

The second stage includes a displacer 26 connected to the displacer 18 for movement therewith. Displacer 26 is disposed within a housing 24. Chamber 22 constitutes a warm chamber for the second stage. Displacer 26 includes a regenerator 30 which may be the same as regenerator 19. The upper end of regenerator 30 communicates with chamber 22 by way of passage 28 in the displacer 26. The cold chamber of the second stage is designated 32. Chamber 32 communciates with the lower end of regenerator 30 by way of radial ports and clearance 34 between the outer periphery of the lower end of regenerator 26 and the inner periphery of housing 24.

The third stage includes a displacer 36 connected to the displacer 26 for movement therewith. Chamber 32 constitutes the warm chamber for the third stage. The cold chamber associated with the third stage is designated 38. A heat station 40 surrounds chamber 38 at the lower end of the housing 35. Chambers 32 and 38 communicate with one another via conduits 42, 44 which are coupled to opposite ends of heat exchanger 46 containing regenerator 48. In the position of the displacers, the direction of flow through the conduits 42, 44 is as shown in FIG. 1. It will be noted that the diameter of each displacer is progressively less and that the regenerator associated with the third stage is external of the third stage. Flow through the heat exchanger 46, common to both refrigerators 12 and 14, is in counter-flow and reversing each one half cycle.

A motor 50 is provided within housing 16 between the refrigerators 12 and 14. Motor 50 is preferably a dc electrical stepping motor having a variable speed drive with an output shaft at each end thereof. The output shaft at one end of the motor 50 is connected to the displacer 18 while the output shaft at the other end of the motor 50 is connected to the displacer 18' in a manner so that the displacers are 180° out of phase with one another. Only the coupling between motor and displacer 18 will be described in detail.

Figure 2:
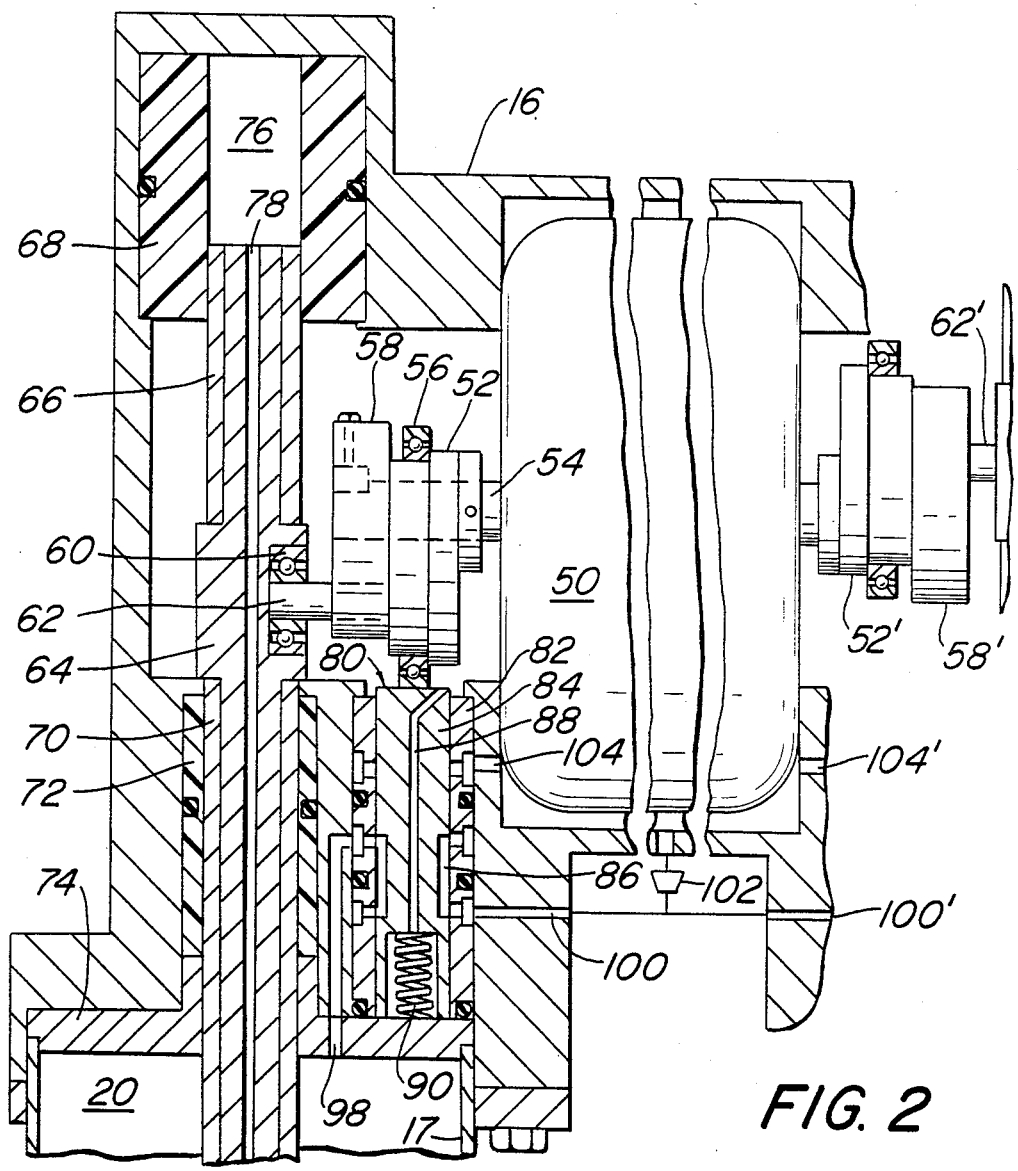
FIG. 2 is an enlarged detail view of a portion of the apparatus shown in FIG. 1.

Reference is made to FIG. 2 which illustrates the structure at the upper left hand corner of FIG. 1 on an enlarged scale. A cam 52 is connected to the output shaft 54 at one end of motor 50. A cam 52' is connected to the output shaft at the other end of motor 50. Cams 52 and 52' are 180° out of phase. A roller bearing type follower 56 is connected to the outer periphery of cam 52. A crank arm 58 is connected to shaft 54. Crank arm 58 is connected to a roller bearing type follower 60 by shaft 62. Shafts 54 and 62 are parallel. Follower 60 is disposed within a transverse slot on slide 64. Slide 64 is connected to the upper end of displacer 18.

The slide 64 has a cylindrical bearing insert 66 guided by clearance sleeve bearing 68. The slide 64 also has a cylindrical bearing insert 70 guided by clearance sleeve bearing 72. The bearing inserts are preferably made from a hard material such as heat treated tool steel and sleeve bearings from a low friction plastic compound impregnated with other materials for stabilization and reduced wear. The sleeve bearing 72 is held in place at its lower end by retainer 74 connected to the housing 16. A chamber 76 within sleeve bearing 68 communicates with the regenerator 19 by way of an axial flow passage 78 in the slide 64. Passage 78 prevents gases from being compressed within chamber 76 as the slide 64 moves upwardly. Hence, slide 64 is gasbalanced when its diameter is uniform at its ends.

The housing 16 includes a bore parallel to the slide 64 and opposite the periphery of cam 52. Within said bore there is provided a spool valve designated generally as 80. Valve 80 includes a clearance seal sleeve bearing 82 preferably made from a fine grained metallic material. Valve 80 includes a cylindrical spool valve member 84 within the sleeve bearing 82. Valve member 84 has a groove 86 on its outer periphery at a location between its ends and has an axially extending equalizing passage 88. Seals such as O-ring seals are preferably provided on various elements as illustrated in the figures of the drawings. A coil spring is preferably provided between the retainer 74 and a recess in the lower end of valve member 84 for biasing the valve member 84 into contact with follower 56 on cam 52. The valve member 84 is moved downwardly by the cam 52 and is moved upwardly by expansion of spring 90. Passage 88 prevents compression of gases within said recess containing spring 90.

Figure 3:
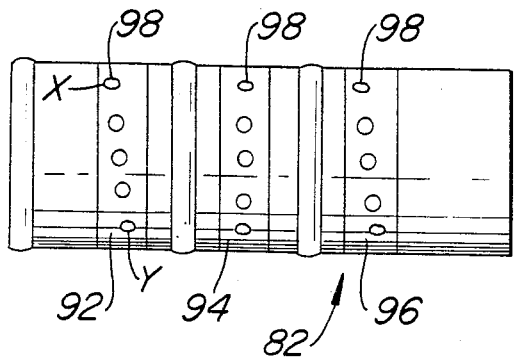
FIG. 3 is an elevation view of a valve bearing sleeve.

Referring to FIGS. 2 and 3, the sleeve bearing 82 has axially spaced grooves 92, 94 and 96 on its outer periphery. Flow passages 98 extend radially through the wall at the bottom of each of the grooves. As shown more clearly in FIG. 3, the flow passages 98 in grooves 92, 96 have their axes on a line skewed relative to a circumference by an angle of about 3°. Hence, when one of the flow passages 98 designated X is fully open, another flow passage designated Y is just starting to open and vice versa. Flow through the passages 98 between those designated X and Y are at an intermediate stage of partial flow. Thus, the passages 98 in grooves 92, 96 are in a helical pattern and preferably have a diameter between 0.031 and 0.093 inches when bearing 82 has an inner diameter of 0.5 inches. The number of flow passages 98 may be increased or decreased as desired with an appropriate change of diameter to handle the desired flow rate.

In the position of valve member 84 as shown in FIG. 2, the groove 86 communicates with the warm chamber 20 by way of passage 98. Also, groove 86 communicates with the high pressure inlet passage 100. Passage 100 is connected to the output of compressor 102. When the valve member 84 is in its uppermost position, passage 98 communicates with passage 104 via groove 86. Passage 104 communicates with the interior of the motor housing which in turn is coupled to the inlet or low pressure side of compressor 102.

The housing 16 is constructed of a number of components so as to facilitate machining, assembly, access to the slide 64 and valve 80, etc. The manner in which the housing is comprised of a plurality of components is not illustrated but will be obvious to those skilled in the art. The refrigerator 10 is preferably designed for use with a cryogenic fluid such as helium but other fluids such as air and nitrogen may be used.

OPERATION

As shown in FIG. 1, each of the displacers associated with refrigerator 12 is at bottom dead center while each of the displacers associated with the refrigerator 14 is at top dead center. Vertical reciprocation of slide 64 is controlled by the rotative position of cam 52. The spool valve member 84 is in its lowermost position with the spring 90 compressed due to contact between valve member 84 and the follower 56 on cam 52. High pressure fluid is introduced through passage 100 to groove 86 and passage 98 and then to the warm chamber 20. Passage 104 is blocked by the valve member 84.

The function of each of the regenerators 19, 30 and 48 is to cool the gas passing downwardly therethrough and to heat gas passing upwardly therethrough. In passage downwardly through the regenerators, the gas is cooled thereby causing the pressure to decrease and further gas to enter the system to maintain the maximum cycle pressure. The decrease in temperature of the gas in chamber 38 is useful refrigeration which is sought to be obtained by the apparatus at the heat station 40.

As the gas flows upwardly through the regenerators 19, 30 and 48, it is heated by the matrix associated therewith to near ambient temperature thereby cooling the associated matrix. As gas is flowing downwardly through heat exchanger 46, gas flows in the opposite direction through heat exchanger 46' whereby the heat exchangers are generally more balanced.

As the motor 50 rotates cam 52, the displacers of refrigerator 12 move upwardly from bottom dead center while the displacers of refrigerator 14 move downwardly from top dead center. As the cam 52 continues to rotate, valve member 84 moves upwardly under the pressure of spring 90. After valve member 84 is moved sufficiently upwardly, it closes off flow from passage 100 to the groove 86.

As the cam 52 continues to rotate, the slide 64 continues to move upwardly. As the slide 64 approaches top dead center, the follower 56 permits the valve member 84 to be reciprocated sufficiently upwardly so as to cause groove 86 to communicate passage 98 with passage 104 and thereby commence the exhaust portion of the cycle. The passages 98 in grooves 92, 96 are progressively opened to full flow. During this period, the pressure in the displacers will decrease and thus the pressure difference across the valve member 84 will be decreasing thereby requiring more flow area (more passages 98 being fully open) to fully exhaust the volume from the displacers.

The technique of matching the flow area to pressure difference across the valve member 84 will make it possible to approach a constant mass flow rate into and out of the displacers and thereby increase the dwell time of the fluid within the matrix of the regenerators while reducing pressure-drop induced flow losses and shocks to the drive mechanism.

A typical embodiment of the apparatus 10 operates at the rate of 72 to 80 cycles per minute. The reciprocatory movement of displacers 18, 26 and 36 is synchronized to occur simultaneously in the same direction with the valve member 84 and 180° out of phase with the corresponding elements of refrigerator 14. Timing is controlled by the cams so that the associated valve members reciprocate at a different rate from the rate of reciprocation of the associated displacers.

The present invention solves the problem of operating two cryogenic refrigerators with a proper timing and phase relationship which is constant by using a motor 50 having a double shaft for moving the displacers in each refrigerator. This arrangement assures that the refrigerators will be in absolute time, 180° out of phase. The present invention also solves the problem of attaining reasonably well-balanced mass flows through the final heat exchange element of each refrigerator. Market potential for the apparatus of the present invention includes use in nuclear magnetic resonance scanning devices, superconducting quantum interference devices, operation of computer chips, infrared detectors, small superconducting magnets, etc. The concept of the present invention may be utilized in connection with similar refrigerators using a different cycle such as the Sterling cycle.

With the motor 50 operating at 72 r.p.m., during cool down only about 30% of the available compressor capacity is used at the start. By providing a variable speed drive for motor 50, the speed thereof can be increased to make use of the full capacity of compressor 102 and gradually slowed as the machine cools. This procedure will reduce the amount of time required to cool the apparatus. By reducing the motor speed at low temperaure, a lower temperature can be reached.

The present invention may be embodied in other specific forms without departing from the spirit or essential attributes thereof and, accordingly, reference should be made to the appended claims, rather than to the foregoing specification, as indicating the scope of the invention.

We claim:

1. Cryogenic apparatus comprising first and second cryogenic refrigerators each having multiple stages, said first and second refrigerators being arranged in parallel, each stage of said refrigerators including a displacer within a housing, said housing having a warm chamber above said displacer and a cold chamber below said displacer, a regenerator in communication with said warm and cold chambers, said stages of each refrigerator being arranged in series, said displacers of each refrigerator being connected for reciprocal movement together, motor means associated with said refrigerators for reciprocally moving said displacers of said refrigerators in 180° out of phase relation, and the last stage of each refrigerator being coupled to a recuperative heat exchanger, said heat exchanger containing said regenerator of the last stage of each said refrigerator.

2. Apparatus in accordance with claim 1 wherein said motor means is a single electrical motor in driving relationship with each refrigerator.

3. Apparatus in accordance with claim 2 wherein said motor is a dc stepping motor having a variable speed drive.

4. Apparatus in accordance with claim 1 including a single compressor for supplying high pressure fluid to the first refrigerator while exhausting low pressure fluid from the second refrigerator.

5. Apparatus in accordance with claim 1 wherein each refrigerator has three stages, said regenerators being associated with the third stage and external thereof and arranged for counterflow of fluid therethrough.

6. Apparatus in accordance with claim 1 wherein said refrigerators are disposed side-by-side with said motor means being at one end and said regenerators being at the other end.

7. Apparatus in accordance with claim 1 wherein said motor means further comprises coupling means, said coupling means being adapted for translating rotating motion of said motor means into reciprocal motion of said displacers.

8. Apparatus in accordance with claim 7 wherein said coupling means includes a motor output shaft, a cam affixed to said output shaft, said output shaft being eccentrically disposed on said cam, a cam shaft affixed on said cam, said cam shaft being parallel to said output shaft, said cam shaft being eccentrically disposed on said cam, a slide movably coupled to said cam shaft, and said slide connected to said displacer of a first stage of said refrigerator.

9. A method for obtaining refrigeration in a temperature range of 4.5°–10° K. comprising the steps of:
 (a) operating first and second multi-stage cryogenic refrigerators by a common motor to cause a displacer in the first refrigerator is 180° out of phase with a displacer in the second refrigerator;
 (b) introducing a first fluid at a high pressure into a first warm chamber of the first refrigerator;
 (c) simultaneously cooling and decreasing the pressure of the first fluid as the first fluid passes through successive stages of the first refrigerator;
 (d) maintaining a maximum cycle pressure in the first refrigerator;
 (e) placing regenerators of the final stages of said refrigerators in a counterflow recuperative heat exchanger;

(f) utilizing the cooled first fluid from step (c) in the heat exchanger;
(g) simultaneously with step (c) heating a second fluid as the second fluid passes from said heat exchanger through successive stages of the second refrigerator to a warm chamber of the first stage of the second refrigerator;
(h) simultaneously with step (b) exhausting the second fluid from the warm chamber of the second refrigerator;
(i) repeating steps (a)–(h) whereby in each successive repetition of steps (a)–(h) the first and second refrigerators alternate between cooling and heating of the first fluid and the second fluid.

10. A method in accordance with claim 9 including decreasing the speed of said motor as lower temperatures are reached.

11. A method in accordance with claim 9 including providing generally balanced mass flow through said regenerators.

12. A method in accordance with claim 9 including supplying the first fluid to the first refrigerator from a single compressor and exhausting the second fluid from the second refrigerator to the compressor.

* * * * *